(12) United States Patent
Suwankasab et al.

(10) Patent No.: US 9,257,374 B1
(45) Date of Patent: Feb. 9, 2016

(54) THIN SHRINK OUTLINE PACKAGE (TSOP)

(71) Applicant: NXP B.V., Eindhoven (NL)

(72) Inventors: Chanon Suwankasab, Pathumthani (TH); Amornthep Saiyajiatara, Bangkok (TH)

(73) Assignee: NXP B.V., Eindhoven (NL)

(*) Notice: Subject to any disclaimer, the term of this patent is extended or adjusted under 35 U.S.C. 154(b) by 0 days.

(21) Appl. No.: 14/582,521

(22) Filed: Dec. 24, 2014

(51) Int. Cl.
*H01L 23/495* (2006.01)
*H01L 23/31* (2006.01)
*H01L 23/00* (2006.01)

(52) U.S. Cl.
CPC ...... *H01L 23/49555* (2013.01); *H01L 23/3107* (2013.01); *H01L 24/49* (2013.01); *H01L 2224/48247* (2013.01); *H01L 2224/4912* (2013.01)

(58) Field of Classification Search
CPC ............ H01L 23/057; H01L 2225/1029; H01L 23/49541; H01L 21/4821
USPC ............................ 257/666, 676, 784
See application file for complete search history.

(56) References Cited

U.S. PATENT DOCUMENTS

| | | | | |
|---|---|---|---|---|
| 6,134,700 A | * | 10/2000 | Goto | H01L 23/49541 257/666 |
| 7,804,693 B2 | * | 9/2010 | Jang | H01L 23/49838 361/772 |
| 2001/0006250 A1 | * | 7/2001 | Kang | H01L 23/49541 257/666 |
| 2004/0126932 A1 | * | 7/2004 | Ito | H01L 23/4334 438/123 |
| 2010/0244281 A1 | * | 9/2010 | Hayashi | H01L 23/49572 257/784 |
| 2014/0264798 A1 | * | 9/2014 | Otremba | H01L 24/29 257/675 |

* cited by examiner

*Primary Examiner* — S. V. Clark

(57) ABSTRACT

Consistent with an example embodiment, a thin outline shrink package (TSOP) provides for a significant reduction in lead pitch along with a reduced package profile for a semiconductor device die packaged, therein.

8 Claims, 4 Drawing Sheets

DETAIL: X

DETAIL: X

THIN SHRINK OUTLINE PACKAGE (TSOP)

FIELD

The disclosed is directed electronic packaging. More particular, the disclosed is directed to packaging having a reduced profile.

BACKGROUND

The electronics industry continues to rely upon advances in semiconductor technologies to realize higher-function devices in more compact areas. For many applications realizing higher-functioning devices requires integrating a large number of electronic devices into a single silicon wafer. As the number of devices per given area of the silicon wafer increases, the manufacturing process becomes more difficult.

Many varieties of semiconductor devices have been manufactured having various applications in numerous disciplines. Such silicon-based semiconductor devices often include metal-oxide-semiconductor field-effect transistors (MOSFET), such as p-channel MOS (PMOS), n-channel MOS (NMOS) and complementary MOS (CMOS) transistors, bipolar transistors, BiCMOS transistors. Such MOSFET devices include an insulating material between a conductive gate and silicon-like substrate; therefore, these devices are generally referred to as IGFETs (insulated-gate FET).

Having manufactured a number of electronic devices on a wafer substrate, a particular challenge is to package these devices for their given purpose. As the complexity of portable systems increases, there is a commensurate reduction in the size of the individual components which make up the system; the system often is laid out on a printed circuit substrate.

SUMMARY

One way to reduce the size of individual components is through techniques that reduce the size of packages which contain these devices. There is a need for packaging that can address the needs of reducing the space consumed on printed circuit board subsystems.

The present disclosure is has been found useful in the packaging of devices in circuit sub-systems whose space is limited. For example, a TSOP (thin shrink outline package) having eight or more I/O terminals provides for a thinner product device with shortened interconnects between wire bonds and package terminals. Shortened interconnects may serve to reduce any parasitic capacitance and inductance which may reduce device performance which ultimately affects system performance. The reduced packaging footprint also lowers product cost.

In an example embodiment, there is a semiconductor device comprising a device die. A package structure defines a rectangular boundary and having a top surface and an opposite bottom surface, the device die mounted to the top surface on a die attach pad enclosed by the rectangular boundary. A first plurality of terminal I/O leads extends from one side of the rectangular boundary, the first plurality of terminal I/O leads electrically connected to the device die by wire bonds; a second plurality of terminal I/O leads extending from another opposite side of the rectangular boundary, the second plurality of terminal I/O leads electrically connected to the device die by wire bonds. The terminal I/O leads have a pitch of about 0.65 mm and have a length about 0.5 mm from the rectangular boundary.

In another example embodiment, molded semiconductor device comprises a device die of a size. A package structure defines a rectangular boundary and having a top surface and an opposite bottom surface; the device die is mounted to the top surface on a die attach pad enclosed by the rectangular boundary. A first plurality of our terminal I/O leads extend from one side of the rectangular boundary, the first plurality of terminal I/O leads electrically connected to the device die by wire bonds. From another opposite side of the rectangular boundary, a second plurality of four terminal I/O leads extending from another opposite side of the rectangular boundary, the second plurality of terminal I/O leads electrically connect to the device die by wire bonds. A molding compound envelopes the package structure, the device die and wire bonds that extend to an edge of the rectangular boundary. The terminal I/O leads have a pitch of about 0.65 mm and have a length about 0.5 mm from the edge of the rectangular boundary. Dimensions of the molded semiconductor device have a height of about 1.1 mm, a length of about 2.8 mm, and a width of about 2.0 mm. The terminal I/O leads have a bend of about 8 degrees with respect to a horizontal plane of the rectangular boundary edge.

The above summaries of the present disclosure are not intended to represent each disclosed embodiment, or every aspect, of the present invention. Other aspects and example embodiments are provided in the figures and the detailed description that follow.

BRIEF DESCRIPTION OF THE DRAWINGS

The invention may be more completely understood in consideration of the following detailed description of various embodiments disclosed in connection with the accompanying drawings, in which.

Figure 1:
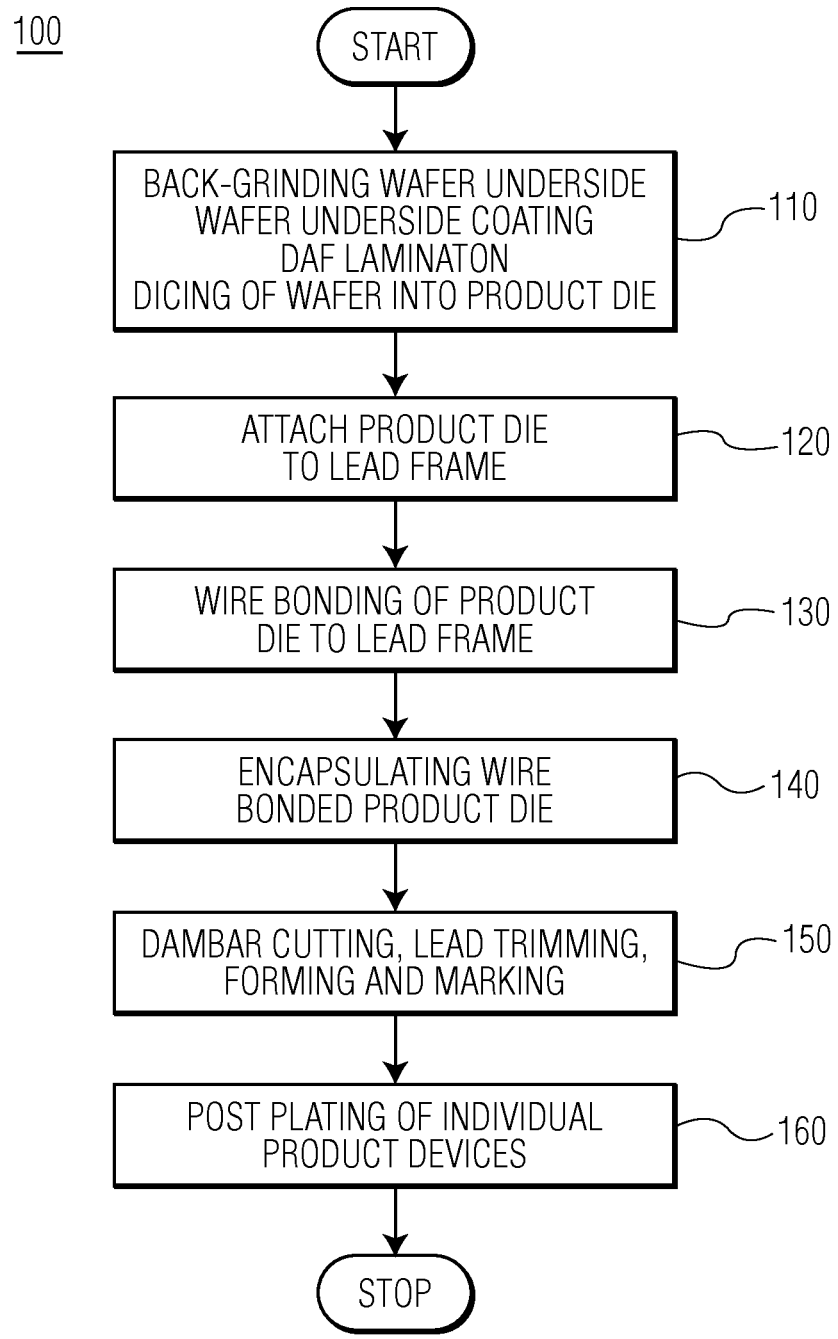
FIG. 1 is an example process which may be used to assemble an electronic package according to an embodiment of the present disclosure.
Figure 2A:
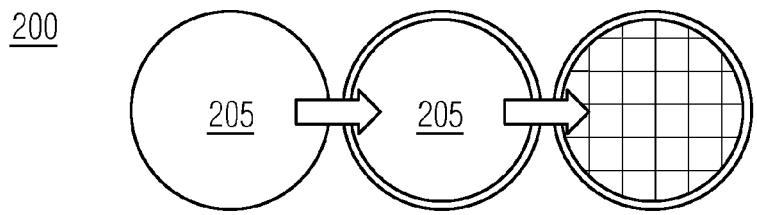
FIGS. 2A-2F illustrates in side-views the assembly of the package according to the example of FIG. 1.
Figure 2B:
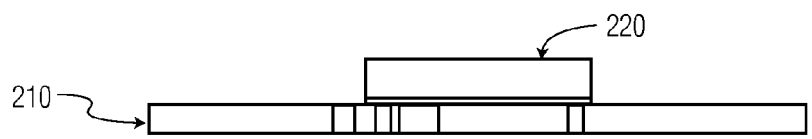
Figure 2C:
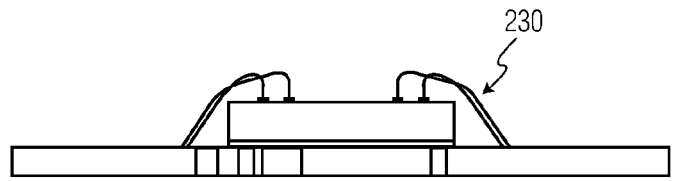
Figure 2D:
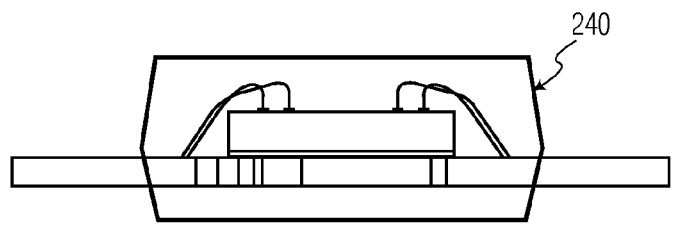
Figure 2E:
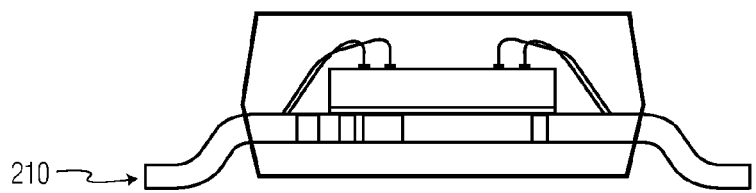
Figure 2F:
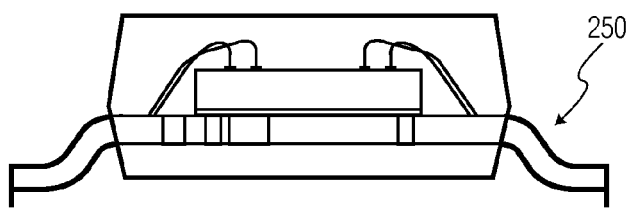

While the disclosed is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the spirit and scope of the disclosure as defined by the appended claims.

Throughout the description, similar reference numbers may be used to identify similar elements.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the disclosure.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

DETAILED DESCRIPTION

The disclosed embodiments have been found useful providing a package suitable for use in automotive applications. Current package platforms in use are SO8 and HVSON8. However, with the trend in reducing package size and cost, these two existing package platforms may be unsuitable. For example, an eight-pin package is needed that is lighter weight, thinner, smaller; further, these attributes result in lower cost.

The use of the TSOP package provides significant cost benefits as an alternative to current packaging platforms. The TSOP8 package, according to the present disclosure, may be fabricated with a metal lead frame with or without pre-plating. The die bonding adhesive may be a B-stage cured material; the material in an example process may either be wafer backside coating (WBC) or a die attach film (DAF). Wire bonding materials may be any suitable alloy, such as (Au) gold-based alloys, (Ag) silver-based alloys, copper (Cu) or copper-based materials. The active device die, after die bonding and wire bonding may be encapsulated in an epoxy-based molding compound. As necessary to enhance solderability, the assembled TSOP8 package may undergo plating with a suitable metal. After encapsulation, the TSOP8 package undergoes lead forming and singulation.

Refer to FIG. 1. In an example embodiment, the disclosed package may be assembled per an example process. In step 110 the wafer underside undergoes a back grinding. Wafer thickness, after back-side grinding, in an example process may be in the range of about 150 μm to about 250 μm. For example, a pre-grinding thickness, of an "eight-inch" wafer (200 mm) is about 725 μm; the pre-grinding thickness for a "six-inch" wafer (150 mm) is about 675 μm.

A protective coating is applied to the ground underside, followed by placement onto a die attach film (DAF). The wafers are diced into individual product devices. In step 120, the product device is attached to a lead frame in accordance with the present disclosure. In step 130, the product device is wire bonded to terminal I/O pads on the lead frame. In step 140, the wire bonded product device is encapsulated. In step 150, encapsulated product device undergoes dambar cutting, lead trimming, forming, and marking. If necessary, in step 160 the assembled product devices undergo a post plating process.

Refer to FIGS. 2A-2F. In a series of views 200, a wafer 205 is separated into individual product devices 220 and these product devices are mounted onto a lead frame 210 (the lead frame having an array of device positions). The product devices have wire bonds 230. An encapsulant 240 envelopes the product devices 220. The lead frame 210 is has a bend 215. A plating 250 enhances the solderability of the assembled device 260. For example, upon a base metal, copper (Cu) leadframe, a tin/lead alloy of about 400 μm may be applied, after assembly. In another example embodiment, the lead frame may be pre-plated (e.g., NiPd, NiPdAu, etc.). Upon the base metal copper, the pre-plated lead frame has a nickel thickness of about 25 μm, the palladium (Pd) thickness of about 0.5 μm, and a thin layer of gold (Au), gold/silver (Au/Ag) or palladium/silver (Pd/Ag)

Figure 3:
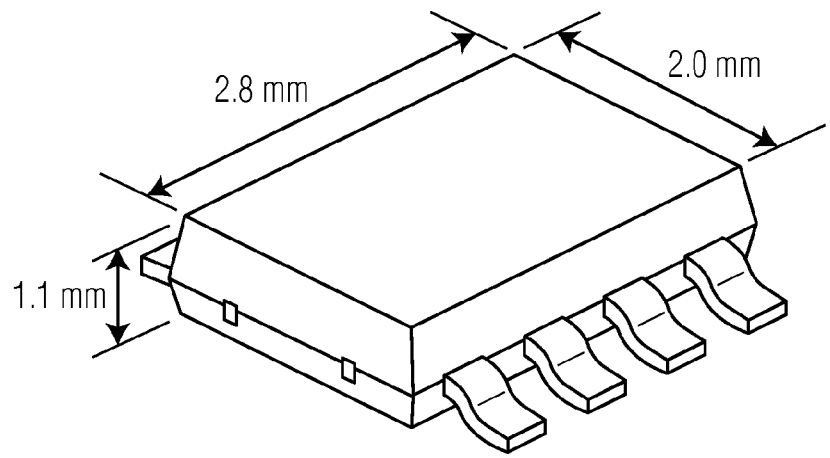
FIG. 3 is a perspective view of an assembled package according to an embodiment of the present disclosure.
Figure 4A:
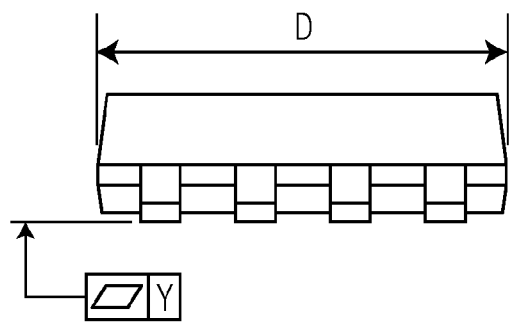
FIGS. 4A-4D a top and side views of a package according to an embodiment of the present disclosure.
Figure 4B:
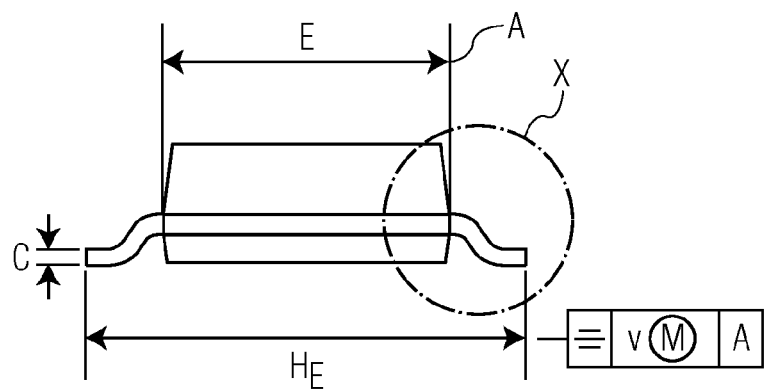
Figure 4C:
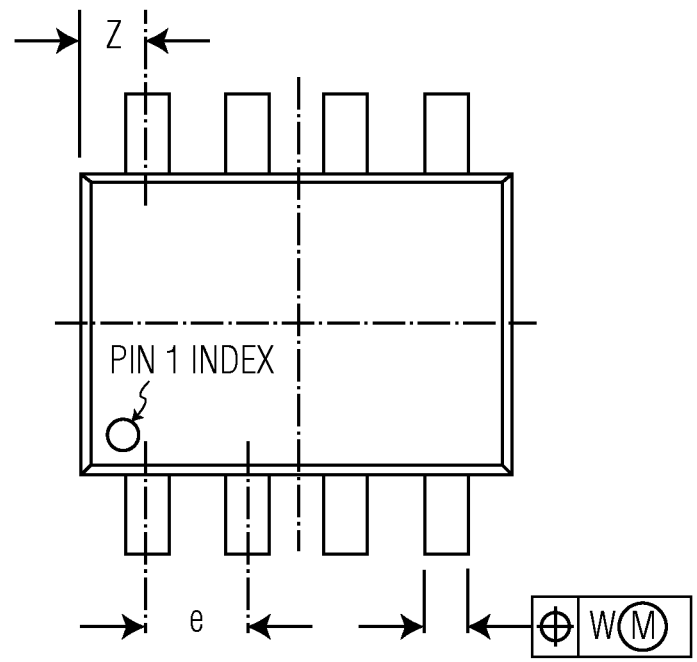
Figure 4D:
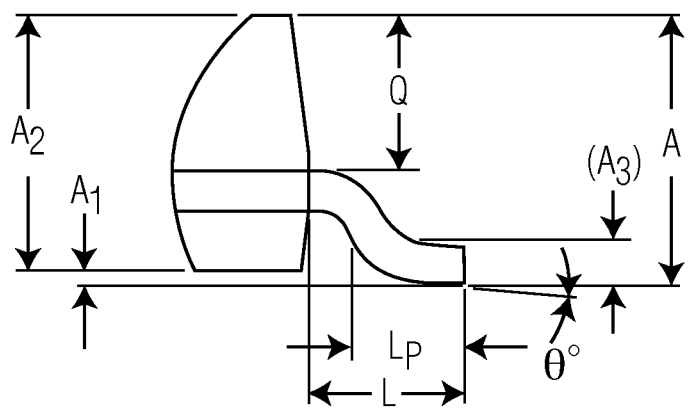

Refer to FIG. 3. A device 300 has been assembled in a TSOP8 package 300. The package 300 has a height 310 of about 1.1 mm, a length 320 of about 2.8 mm, and a width 330 of about 2.0 mm. The metal lead frame used has eight I/O terminals 340; these terminals 340 have been plated to enhance solderability. The lead pitch is about 0.65 mm, the lead pitch being the space between leads with respect to their centers. The die attach adhesive used may be WBC, DAF or any epoxy base. Molding compound is a type used for this package type. Interconnects (i.e., wirebonds) may either be gold (Au) or copper (Cu) with a forward or reverse bond. A maximum die size is about 1.37 mm×2.40 mm.

Refer to FIGS. 4A-4D. These are various views of the TSOP8 package as depicted in FIG. 3. Table 1 presents the dimensions of an example package.

TABLE 1

Dimensions for TSOP8 Package
DIMENSIONS (millimeters are the original dimensions)

| Unit | | A | $A_1$ | $A_2$ | $A_3$ | $b_p$ | c | $D^{(1)}$ | $D_h$ | $E^{(2)}$ | $E_h$ | e | $H_E$ | L | $L_p$ | Q | v | w | y | $Z^{(1)}$ | θ |
|---|---|---|---|---|---|---|---|---|---|---|---|---|---|---|---|---|---|---|---|---|---|
| mm | MAX | 1.1 | 0.10 | 1.0 | | 0.40 | 0.26 | 3.0 | — | 2.17 | — | | 3.2 | 0.6 | | | | | | | 8° |
| | NOM | | | | 0.15 | | | | | | | 0.65 | | 0.5 | | 0.5 | 0.20 | 0.20 | 0.10 | — | |
| | MIN | 0.8 | 0.01 | 0.8 | | 0.25 | 0.10 | 2.6 | — | 1.77 | — | | 2.8 | 0.2 | | | | | | | 0° |

Various exemplary embodiments are described in reference to specific illustrative examples. The illustrative examples are selected to assist a person of ordinary skill in the art to form a clear understanding of, and to practice the various embodiments. However, the scope of systems, structures and devices that may be constructed to have one or more of the embodiments, and the scope of methods that may be implemented according to one or more of the embodiments, are in no way confined to the specific illustrative examples that have been presented. On the contrary, as will be readily recognized by persons of ordinary skill in the relevant arts based on this description, many other configurations, arrangements, and methods according to the various embodiments may be implemented.

To the extent positional designations such as top, bottom, upper, lower have been used in describing this disclosure, it will be appreciated that those designations are given with reference to the corresponding drawings, and that if the orientation of the device changes during manufacturing or operation, other positional relationships may apply instead. As described above, those positional relationships are described for clarity, not limitation.

The present disclosure has been described with respect to particular embodiments and with reference to certain drawings, but the invention is not limited thereto, but rather, is set forth only by the claims. The drawings described are only schematic and are non-limiting. In the drawings, for illustrative purposes, the size of various elements may be exaggerated and not drawn to a particular scale. It is intended that this disclosure encompasses inconsequential variations in the relevant tolerances and properties of components and modes of operation thereof. Imperfect practice of the invention is intended to be covered.

Where the term "comprising" is used in the present description and claims, it does not exclude other elements or steps. Where an indefinite or definite article is used when referring to a singular noun, e.g. "a" "an" or "the", this includes a plural of that noun unless something otherwise is specifically stated. Hence, the term "comprising" should not be interpreted as being restricted to the items listed thereafter; it does not exclude other elements or steps, and so the scope of the expression "a device comprising items A and B" should not be limited to devices consisting only of components A and B. This expression signifies that, with respect to the present disclosure, the only relevant components of the device are A and B.

Numerous other embodiments of the invention will be apparent to persons skilled in the art without departing from the spirit and scope of the invention as defined in the appended claims.

The invention claimed is:

1. A semiconductor device comprising:
 a device die;
 a package structure defining a rectangular boundary and having a top surface and an opposite bottom surface, the device die mounted to the top surface on a die attach pad enclosed by the rectangular boundary;
 a first plurality of terminal I/O leads extending from one side of the rectangular boundary, the first plurality of terminal I/O leads electrically connected to the device die by wire bonds;
 a second plurality of terminal I/O leads extending from another opposite side of the rectangular boundary, the second plurality of terminal I/O leads electrically connected to the device die by wire bonds;
 wherein the terminal I/O leads have a pitch of about 0.65 mm and have a length about 0.5 mm from the rectangular boundary.

2. The semiconductor device as recited in claim 1, further comprising a molding compound enveloping the package structure, the device die and wire bonds, that extends to the rectangular boundary.

3. The semiconductor device as recited in claim 1, wherein the number of first plurality of terminal I/O leads is equal to that of the second plurality of terminal I/O leads.

4. The semiconductor device as recited in claim 3, wherein the number of the first plurality of terminal I/O leads is at least four and the number of the second plurality of terminal I/O leads is at least four.

5. The semiconductor device as recited in claim 4, wherein the number of the first plurality of terminal I/O leads is four and the number of the second plurality of terminal I/O leads is four.

6. The semiconductor device as recited in claim 5, wherein the first/second pluralities of terminal I/O leads are bent to about 8 degrees.

7. A molded semiconductor device comprising:
 a device die of a size;
 a package structure defining a rectangular boundary and having a top surface and an opposite bottom surface, the device die mounted to the top surface on a die attach pad enclosed by the rectangular boundary;
 a first plurality of four terminal I/O leads extending from one side of the rectangular boundary, the first plurality of terminal I/O leads electrically connected to the device die by wire bonds;
 a second plurality of four terminal I/O leads extending from another opposite side of the rectangular boundary, the second plurality of terminal I/O leads electrically connected to the device die by wire bonds; and
 a molding compound enveloping the package structure, the device die and wire bonds, that extends to an edge of the rectangular boundary;
 wherein the terminal I/O leads have a pitch of about 0.65 mm and have a length about 0.5 mm from the edge of the rectangular boundary;
 wherein dimensions of the molded semiconductor device have a height of about 1.1 mm, a length of about 2.8 mm, and a width of about 2.0 mm; and
 wherein the terminal I/O leads have a bend of about 8 degrees with respect to a horizontal plane of the rectangular boundary edge.

8. The molded semiconductor device as recited in claim 7, wherein the size of the device die is less about 1.37 mm×2.40 mm.

* * * * *